(12) United States Patent
Takao et al.

(10) Patent No.: US 12,394,744 B2
(45) Date of Patent: Aug. 19, 2025

(54) SEMICONDUCTOR DEVICE (71) Applicant: AOI ELECTRONICS CO., LTD., Kagawa (JP)

(72) Inventors: Katsuhiro Takao, Kagawa (JP); Atsushi Kuroha, Kagawa (JP)

(73) Assignee: AOI ELECTRONICS CO., LTD., Kagawa (JP)

(*) Notice: Subject to any disclaimer, the term of this patent is extended or adjusted under 35 U.S.C. 154(b) by 478 days.

(21) Appl. No.: 17/997,823

(22) PCT Filed: Jul. 13, 2020

(86) PCT No.: PCT/JP2020/027300
§ 371 (c)(1),
(2) Date: Nov. 3, 2022

(87) PCT Pub. No.: WO2021/225006
PCT Pub. Date: Nov. 11, 2021

(65) Prior Publication Data
US 2023/0187405 A1 Jun. 15, 2023

(30) Foreign Application Priority Data
May 8, 2020 (JP) .................................. 2020-082299

(51) Int. Cl.
*H01L 23/00* (2006.01)
*H01L 23/31* (2006.01)
*H01L 23/495* (2006.01)

(52) U.S. Cl.
CPC .......... *H01L 24/40* (2013.01); *H01L 23/3107* (2013.01); *H01L 23/49562* (2013.01);
(Continued)

(58) Field of Classification Search
CPC ...................................................... H01L 24/40
(Continued)

(56) References Cited

U.S. PATENT DOCUMENTS 6,249,041 B1 6/2001 Kasem et al.
2004/0063240 A1 4/2004 Madrid et al.
(Continued)

FOREIGN PATENT DOCUMENTS

JP 2006179735 A 7/2006
JP 2009302564 A 12/2009
(Continued)

OTHER PUBLICATIONS

International Preliminary Report on Patentability in PCT Application No. PCT/JP2020/027300, issued Dec. 28, 2021, 3pp.
(Continued)

*Primary Examiner* — Ajay Arora
(74) *Attorney, Agent, or Firm* — HAUPTMAN HAM, LLP (57) ABSTRACT

A semiconductor device includes: a semiconductor element having a first electrode and a second electrode on a first surface, and a third electrode on a second surface, wherein continuity between the second electrode and the third electrode is controlled by a voltage applied to the first electrode; a conductive first lead that is electrically connected to the first electrode and extends beyond a periphery of the first surface; and a conductive second lead that is electrically connected to the second electrode and extends beyond the periphery of the first surface. At least one edge of the periphery of the first surface faces neither the first lead nor the second lead, and portions of the first lead and the second lead that face the periphery of the first surface are provided with respective grooves.

10 Claims, 4 Drawing Sheets (52) U.S. Cl.
CPC .............. *H01L 24/16* (2013.01); *H01L 24/73* (2013.01); *H01L 2224/1601* (2013.01); *H01L 2224/16245* (2013.01); *H01L 2224/40245* (2013.01); *H01L 2224/73255* (2013.01); *H01L 2924/13091* (2013.01)

(58) Field of Classification Search
USPC ........................................................ 257/666
See application file for complete search history.

(56) References Cited

U.S. PATENT DOCUMENTS

| | | | |
|---|---|---|---|
| 2006/0138532 A1 | 6/2006 | Okamoto et al. | |
| 2007/0132073 A1* | 6/2007 | Tiong ................... | H01L 21/568 |
| | | | 257/E23.092 |
| 2019/0279961 A1 | 9/2019 | Iwasaki et al. | |
| 2019/0304924 A1* | 10/2019 | Niu ........................ | H05K 1/111 |

FOREIGN PATENT DOCUMENTS

| | | |
|---|---|---|
| JP | 2010232365 A | 10/2010 |
| JP | 2013149760 A | 8/2013 |
| JP | 2019153752 A | 9/2019 |

OTHER PUBLICATIONS

International Search Report in PCT Application No. PCT/JP2020/027300, mailed Sep. 24, 2020, 2pp.

\* cited by examiner

SEMICONDUCTOR DEVICE

RELATED APPLICATIONS

The present application is a National Phase of International Application Number PCT/JP2020/027300 filed Jul. 13, 2020, which claims the benefit of priority from Japanese Patent Application No. 2020-082299, filed on May 8, 2020.

TECHNICAL FIELD

The present invention relates to a semiconductor device.

BACKGROUND ART

A semiconductor device having a power semiconductor element such as a MOSFET sealed in a package (sealing portion) has been proposed (see Patent Literature 1). Power semiconductor elements such as MOSFETs are expected to be applied as control elements that control high-voltage power.

CITATION LIST

Patent Literature

Patent Literature 1: U.S. Patent Application Publication No. 2004/0063240 Specification

SUMMARY

Technical Problem

In the power semiconductor elements such as MOSFETs, a high voltage of about 60 to 200 V or more is applied between a gate region (gate electrode) as well as a source region (source electrode) formed on a first surface and a drain region (drain electrode) formed on a second surface, which is the opposite side to the first surface. In addition, almost the same voltage as the voltage applied to the drain region is generated at a periphery of the first surface due to the structure of a MOSFET.

Therefore, when a gate lead connected to the gate region on the first surface and a source lead connected to the source region on the first surface are arranged near the periphery of the first surface of the MOSFET, insulation properties may sometimes be insufficient between the gate lead as well as the source lead and the periphery.

Solution to Problem

According to a first aspect, a semiconductor device includes: a semiconductor element having a first electrode and a second electrode on a first surface facing in a first direction, and a third electrode on a second surface facing in an opposite direction to the first direction, wherein continuity between the second electrode and the third electrode is controlled by a voltage applied to the first electrode; a conductive first lead that is electrically connected to the first electrode and extends along the first surface beyond a periphery of the first surface; and a conductive second lead that is electrically connected to the second electrode and extends along the first surface beyond the periphery of the first surface. The periphery of the first surface of the semiconductor element has edges, at least one of which faces neither the first lead nor the second lead, and portions of the first lead and the second lead that face the periphery of the first surface of the semiconductor element are provided with respective grooves.

Advantageous Effects of Invention

According to the present invention, it is possible to realize a semiconductor device that is excellent in insulation properties between a first lead as well as a second lead formed along a first surface of a semiconductor element and a periphery of the first surface of the semiconductor element.

DESCRIPTION OF EMBODIMENTS (Semiconductor Device of First Embodiment)

Figure 1A:
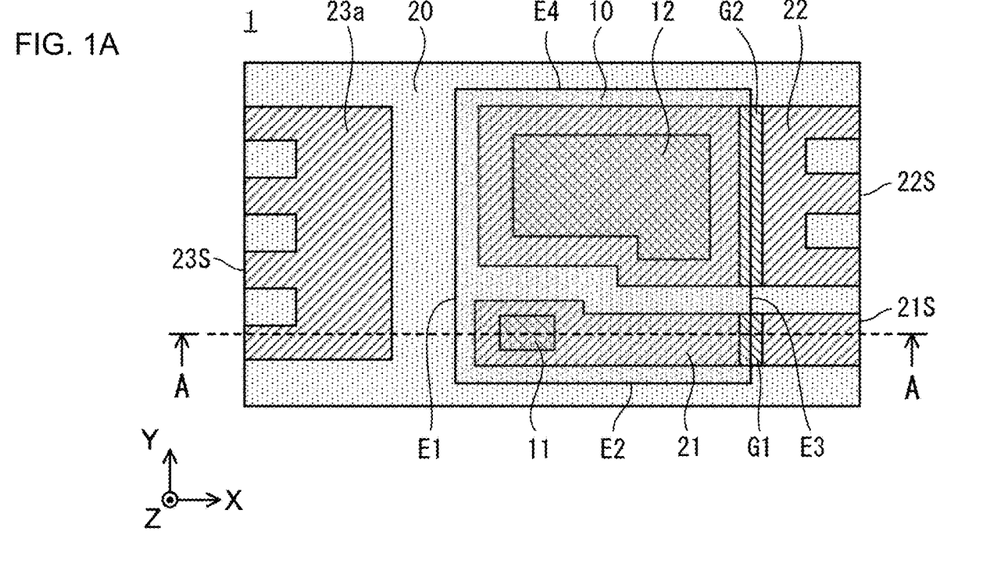
FIGS. 1A and 1B are views illustrating a schematic configuration of a semiconductor device according to a first embodiment.
Figure 1B:
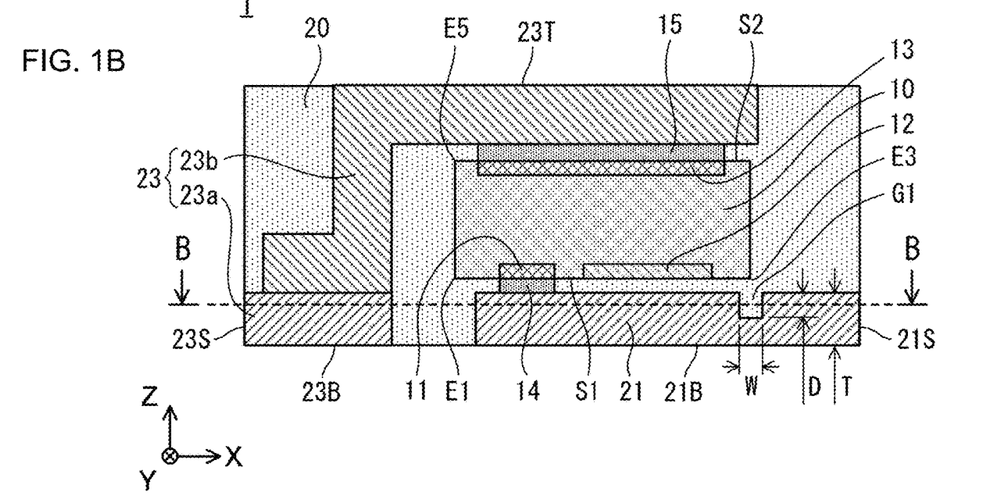

A semiconductor device 1 according to a first embodiment will be described below with reference to FIGS. 1A and 1B. In FIGS. 1A and 1B and subsequent figures, arrows corresponding to the X direction, the Y direction, and the Z direction indicate their respective positive (+) directions. In addition, the X direction, the Y direction, and the Z direction are perpendicular to one another.

In this specification, the −Z direction is also referred to as a "first direction" or a "downward direction". The +Z direction is also referred to as an "upward direction", and viewing an object from the upward direction (+Z direction) is also referred to as a "top view".

FIG. 1A is a view illustrating a top view-state of the semiconductor device 1 according to the first embodiment. FIG. 1B is a view illustrating an XZ plane cross-sectional view of the semiconductor device 1 along an AA cross-section line in FIG. 1A. Note that, for easy understanding, FIG. 1B also shows a part of a second electrode 12 that is not actually on the AA cross-section line, which will be described later.

FIG. 1A illustrates an XY plane cross-sectional view of the semiconductor device 1 along a BB cross-section line in FIG. 1B. Note that, for easy understanding, FIG. 1A also shows a semiconductor element 10, a first electrode 11, and the second electrode 12 that are not actually on the BB cross-section line, which will be described later.

The semiconductor device 1 includes the semiconductor element 10 sealed with a sealing portion 20. The semiconductor element 10 is, for example, a metal oxide semiconductor field effect transistor (MOSFET) as a power semiconductor element. The semiconductor element 10 includes the first electrode 11 as a gate electrode, for example, and the second electrode 12 as a source electrode on a first surface S1 facing in the −Z direction (first direction), for example. The semiconductor element 10 includes a third electrode 13 as a drain electrode on a second surface S2 facing in the opposite direction to the first direction, for example.

Like a general MOSFET, continuity between the second electrode 12 (source electrode) and the third electrode 13 (drain electrode) can be controlled by applying a certain voltage to the first electrode 11 (gate electrode) of the semiconductor element 10. An internal structure of the semiconductor element 10 is similar to that of a general MOSFET and thus will not be described.

The shape of the semiconductor element 10 in the top view, that is, the shape of the first surface S1 in the top view is, for example, rectangular. The first surface S1 has a periphery defined by four edges E1 to E4. An edge E1 is on the −X side of the periphery of the first surface S1, an edge E2 is on the −Y side of the periphery of the first surface S1, an edge E3 is on the +X side of the periphery of the first surface S1, and an edge E4 is on the +Y side of the periphery of the first surface S1.

A first lead 21 made of conductive material is electrically connected to the first electrode 11 on the first surface S1 of the semiconductor element 10 via a bump 14. The first lead 21 extends from under (the −Z side of) the first electrode 11 along the first surface S1, that is, while roughly keeping a certain gap from the first surface S1, in the +X direction beyond the edge E3 constituting the periphery of the first surface S1.

A second lead 22 made of conductive material is electrically connected to the second electrode 12 on the first surface S1 of the semiconductor element 10 via a bump not shown. The second lead 22 extends from under (the −Z side of) the second electrode 12 along the first surface S1 in the +X direction beyond the edge E3 constituting the periphery of the first surface S1.

The gap between the first surface S1 of the semiconductor element 10 and the first lead 21 as well as the second lead 22 is roughly equal to the height of the bump 14, for example, about 0.02 to 0.10 mm.

Meanwhile, as shown in FIG. 1B, a clip portion 23b is connected to the third electrode 13 on the second surface S2 of the semiconductor element 10 via a conductive material 15 such as solder or conductive paste. The clip portion 23b extends from above (the +Z side of) the third electrode 13 along the second surface S2 in the −X direction beyond (to the −X side from) an edge E5 constituting a periphery of the second surface S2. The clip portion 23b on the −X side from the edge E5 bends toward the −Z direction and is electrically connected to a base portion 23a at its tip.

The base portion 23a and the clip portion 23b constitute a third lead 23 as a whole. Between an end of the clip portion 23b and the base portion 23a, a conductive material not shown may be provided.

The first lead 21, the second lead 22, and the third lead 23 are made of conductive material such as metal including copper or the like.

In addition to the semiconductor element 10, at least parts of the first lead 21, the second lead 22, and the third lead 23 is also sealed with the electrically-insulating sealing portion 20. Note that the first lead 21 has a bottom surface 21B facing in the first direction (−Z direction), the second lead 22 has a bottom surface (not shown) facing in the first direction, and the third lead 23 has a bottom surface 23B facing in the first direction. These bottom surfaces are exposed from the sealing portion 20.

The first lead 21 has a side surface 21S facing in the +X direction, that is, on its far side from the semiconductor element 10, and the second lead 22 has a side surface 22S facing in the +X direction, that is, on its far side from the semiconductor element 10. These side surfaces are exposed from the sealing portion 20. The third lead 23 also has a side surface 23S facing in the −X direction, that is, on its far side from the semiconductor element 10, and the side surface is exposed from the sealing portion 20.

The third lead 23 further has a top surface 23T on the +Z side of the clip portion 23b, and the top surface is exposed from the sealing portion 20.

In the semiconductor device 1 according to the first embodiment, the first lead 21 and the second lead 22 are positioned to face only one edge E3 out of the edges E1 to E4 constituting the periphery of the first surface S1 of the semiconductor element 10. Conversely, three edges E1, E2, and E4 out of the edges E1 to E4 constituting the periphery of the first surface S1 of the semiconductor element 10 face neither the first lead 21 nor the second lead 22.

Furthermore, a portion of the first lead 21 that faces the periphery (edge E3) of the first surface S1 of the semiconductor element 10 is provided with a groove G1, and a portion of the second lead 22 that faces the periphery (edge E3) of the first surface S1 of the semiconductor element 10 is provided with a groove G2. The groove G1 increases the gap between the edge E3 of the first surface S1 and the first lead 21 to improve the insulation properties between the edge E3 and the first lead 21. The groove G2 increases the gap between the edge E3 of the first surface S1 and the second lead 22 to improve the insulation properties between the edge E3 and the second lead 22.

Cross-sectional shapes of the grooves G1 and G2 on the XZ plane are not limited to a rectangle as illustrated in FIG. 1B, and may be such a trapezoid that a top of the groove is longer than a bottom of the groove, such a triangle that the groove has a V-shaped bottom, or roughly such a semicircle that the groove has a U-shaped bottom.

The first lead 21 and the second lead 22 has a thickness T of about 0.1 to 0.4 mm, for example. Meanwhile, the grooves G1 and G2 have a depth D of 30% or more and 70% or less of the thickness T described above, for example. When the depth D is 30% or more and 70% or less of the thickness T, it is possible to maintain mechanical stiffness of the first lead 21 and the second lead 22 with the thickness thereof within appropriate bounds, and to improve the insulation properties between the first lead 21 as well as the second lead 22 and the edge E3.

However, if the first lead 21 and the second lead 22 have a sufficiently large thickness T, even when the depth D is smaller than 30% of the thickness T, it is possible to improve the insulation properties between the first lead 21 as well as the second lead 22 and the edge E3. If the first lead 21 and the second lead 33 have a sufficiently large thickness T and have sufficient mechanical stiffness, the depth D may be larger than 70% of the thickness T.

The grooves G1 and G2 have a width W in the X direction (direction in which the first lead 21 and the second lead 22 extend) of about 0.2 to 1 mm, for example.

The center positions in the X direction of the grooves G1 and G2 may be about +40% of the width W or less distant from the position of the edge E3 in the X direction.

In the above-described semiconductor device 1 according to the first embodiment, the three edges E1, E2, and E4 out of the edges E1 to E4 constituting the periphery of the first surface S1 of the semiconductor element 10 face neither the first lead 21 nor the second lead 22. However, as in several variations described later, at least one of the edges E1 to E4 constituting the periphery of the first surface S1 of the semiconductor element 10 may face neither the first lead 21 nor the second lead 22.

Also in that case, it is possible to improve the insulation properties between the periphery of the first surface S1 and the first lead 21 as well as the second lead 22 by forming grooves (G1, G2) in portions of the first lead 21 and the second lead 22 that face the periphery (edges E1 to E4) of the first surface S1.

In the above-described semiconductor device 1 according to the first embodiment, the first lead 21 and the second lead 22 extend in the +X direction with respect to the first electrode 11 and the second electrode 12, respectively, and the third lead 23 (the clip portion 23*b*) extends in the −X direction with respect to the third electrode 13. However, the direction in which the third lead 23 extends is not necessarily opposite to the direction in which the first lead 21 or the second lead 22 extends. For example, the direction in which the third lead 23 extends may be perpendicular to the direction in which the first lead 21 or the second lead 22 extends.

Nevertheless, by setting the direction in which the third lead 23 extends to be opposite to the direction in which the first lead 21 and the second lead 22 extend, it is possible to further improve the insulation properties between the third lead 23, which is connected to the electrode 13 as the drain electrode, that is, to which a high voltage is applied, and the first lead 21 as well as the second lead 22, to which a low voltage is applied.

In the semiconductor device 1 according to the first embodiment, the edge E1 of the periphery (edges E1 to E4) of the first surface S1 of the semiconductor element 10 is located in the −X direction in which the third lead 23 extends. The edge E1 faces neither the first lead 21 nor the second lead 22. That is, neither the first lead 21 nor the second lead 22 extends in the −X direction from the edge E1.

This configuration can increase gaps between the first lead 21 as well as the second lead 22 and the third lead 23 to improve the insulation properties between the first lead 21 as well as the second lead 22 and the third lead 23. Conversely, the third lead 23 can be arranged near the semiconductor element 10 while keeping at least certain gaps to the first lead 21 and the second lead 22, allowing for a further reduction in the size in the X direction of the semiconductor device 1.

Note that the semiconductor device 1 may not necessarily have the third lead 23. For example, unlike the configuration of the semiconductor device 1, the electrode 13 as the drain electrode of the semiconductor element 10 may be wired for an electrical connection and, in that case, the semiconductor device 1 does not require the third lead 23.

Nevertheless, with the third lead 23, it is possible to reduce manufacturing cost in a process of mounting the semiconductor device 1.

The semiconductor device 1 may not necessarily have the sealing portion 20.

Nevertheless, the sealing portion 20 yields an advantage that the semiconductor device 1 is improved in durability and becomes easy to handle.

The shape of the first surface S1 of the semiconductor element 10 in the top view is not necessarily a rectangle, and may be a polygon or the like.

In the above description, the second electrode 12 is the source electrode of the MOSFET and the third electrode 13 is the drain electrode of the MOSFET. However, the second electrode 12 may be the drain electrode of the MOSFET and the third electrode 13 may be the source electrode of the MOSFET.

(How Semiconductor Device of First Embodiment is Mounted on Substrate)

Figure 2:
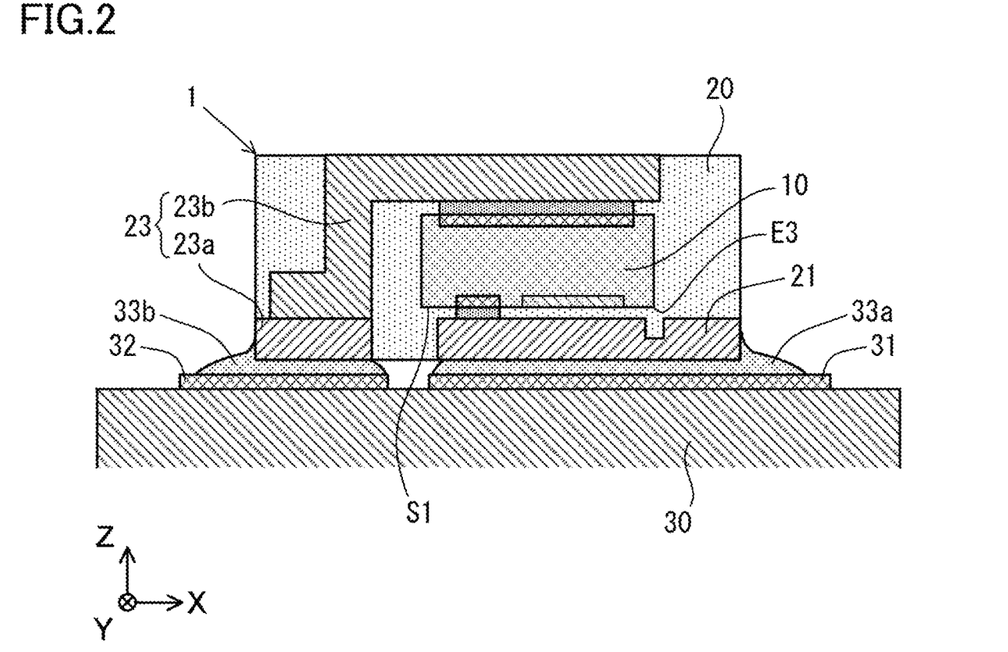
FIG. 2 is a view illustrating a state where the semiconductor device according to the first embodiment is mounted on a wiring substrate.

FIG. 2 is a cross-sectional view illustrating a state where the semiconductor device 1 according to the first embodiment is mounted on a wiring substrate 30 such as a printed substrate. The semiconductor device 1 is mounted on the wiring substrate 30 in such a way that the first lead 21 and the base portion 23*a* of the third lead 23 are mechanically and electrically connected to terminals 31, 32 formed on the wiring substrate 30 via solder joints 33*a*, 33*b*, respectively.

Note that the second lead 22 not shown in FIG. 2 is also mechanically and electrically connected to a terminal not shown formed on the wiring substrate 30 via a solder joint not shown. The second lead 22 and the terminal and the solder joint connected to the second lead 22 are hidden by the terminal 31 and the solder joint 33*a* in FIG. 2, and thus are not shown in FIG. 2.

As described above, in the semiconductor device 1 according to the first embodiment, the first lead 21 and the second lead 22 (see FIGS. 1A and 1B) extend beyond (to the +X side from) the periphery (edge E3) of the first surface S1 of the semiconductor element 10. Thus, in the state of having been mounted on the wiring substrate 30, at least a part of the solder joint 33*a* connected to the first lead 21 can be viewed from the upward direction. The same applies to the solder joint (not shown) connected to the second lead 22. Therefore, quality of soldering can be easily checked.

Even when the semiconductor device 1 includes the sealing portion 20, the respective side surfaces 21S, 22S, 23S of the first lead 21, the second lead 22, and the third lead 23 on their far sides from the semiconductor element 10 are exposed from the sealing portion 20. Therefore, as described above, in the state of having been mounted on the wiring substrate 30, quality of the solder joints 33*a*, 33*b* connected to the first lead 21, the second lead 22, and the third lead 23 can be easily checked.

(Advantageous Effects of Semiconductor Device of First Embodiment)

(1) A semiconductor device 1 according to the first embodiment includes: a semiconductor element 10 having a first electrode 11 and a second electrode 12 on a first surface S1 facing in a first direction (−Z direction), and a third electrode 13 on a second surface S2 facing in an opposite direction to the first direction, wherein continuity between the second electrode 12 and the third electrode 13 is controlled by a voltage applied to the first electrode 11; a conductive first lead 21 that is electrically connected to the first electrode 11 and extends along the first surface S1 beyond a periphery (edges E1 to E4) of the first surface S1; and a conductive second lead 22 that is electrically connected to the second electrode 12 and extends along the first surface S1 beyond the periphery (edges E1 to E4) of the first surface S1. At least one edge E1 of the periphery of the first surface S1 of the semiconductor element 10 faces neither the first lead 21 nor the second lead 21, and portions of the first lead 21 and the second lead 22 that face the periphery (edges E2 to E4) of the first surface S1 of the semiconductor element 10 are provided with respective grooves.

With this configuration, it is possible to realize the semiconductor device 1 that is excellent in the insulation properties between the first lead 21 as well as the second lead 22 formed along the first surface S1 of the semiconductor element 10 and the periphery (edges E1 to E4) of the first surface S1 of the semiconductor element 10.

In the conventional semiconductor device disclosed in Patent Literature 1, a bump or an electrode post connecting a semiconductor element and a lead may be thickened in order to improve insulation properties between the semiconductor element and the lead, which would cause a high resistance value and an increase in the size of the semiconductor device.

Meanwhile, in the above-described semiconductor device 1 according to the first embodiment, it is possible to improve the insulation properties between the semiconductor element 10 and the first lead 21 as well as the second lead 22 without increasing an electrical resistance between the semiconductor element and the leads and without increasing the size of the semiconductor device 1

The following variations also fall within the scope of the present invention. One or more of the variations can also be combined with the above-described embodiment.

(Semiconductor Device of Variation 1)

A semiconductor device 1a according to a variation 1 will be described with reference to FIGS. 3A and 3B. Note that a most part of a configuration of the semiconductor device 1a according to the variation 1 is common to the above-described semiconductor device 1 according to the first embodiment. Thus, differences between them will be mainly described below, and common components are denoted by the same reference symbols and will not be described as appropriate.

Figure 3A:
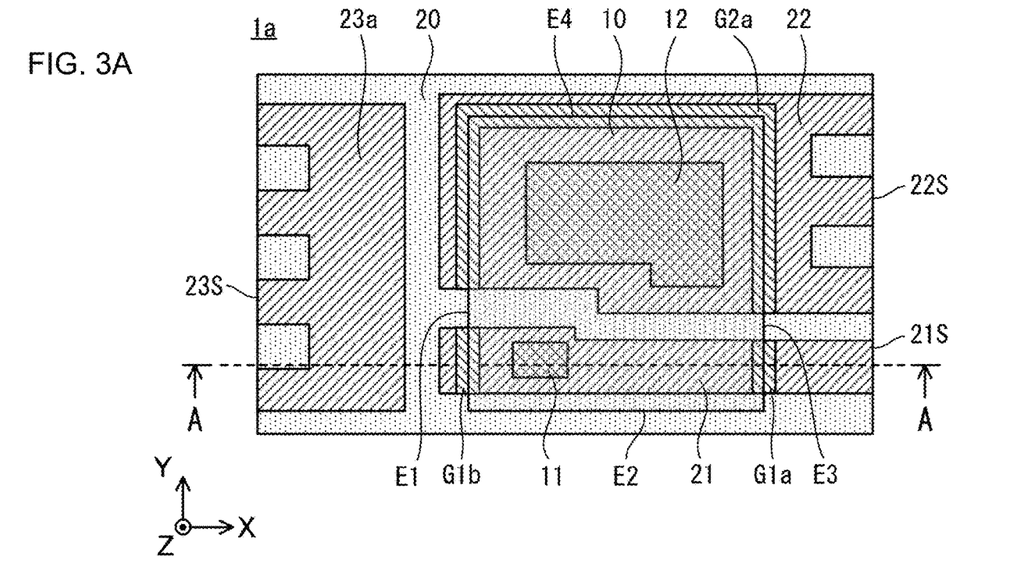
FIGS. 3A and 3B are views illustrating a schematic configuration of a semiconductor device according to a variation 1.
Figure 3B:
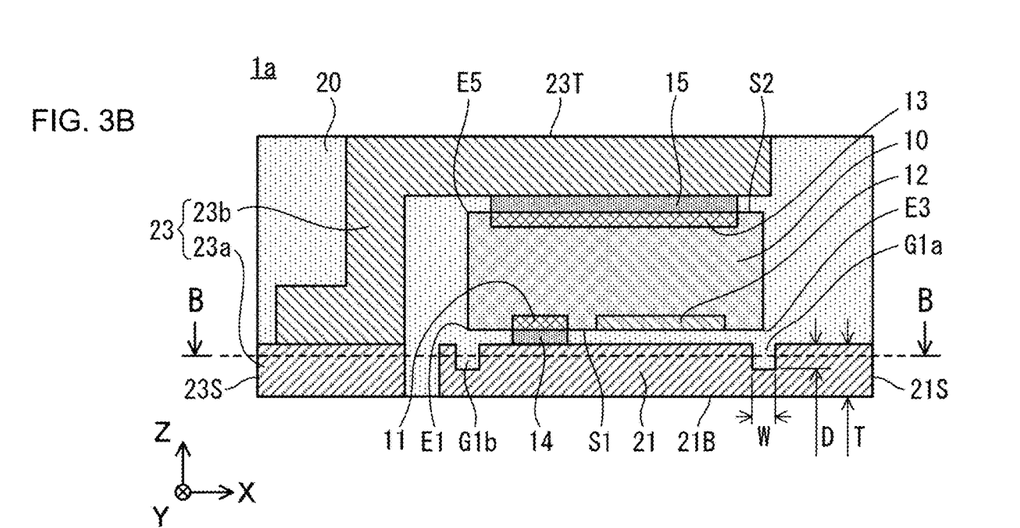

FIG. 3A is a view illustrating a top-view state of the semiconductor device 1a according to the variation 1. FIG. 3B is a view illustrating an XZ plane cross-sectional view of the semiconductor device 1a along an AA cross-section line in FIG. 3A. FIG. 3A illustrates an XY plane cross-sectional view of the semiconductor device 1a along a BB cross-section line in FIG. 3B. As in FIGS. 1A and 1B described above, for easy understanding, FIG. 3A shows a part of a component that is not actually on the BB cross-section line, and FIG. 3B shows a part of a component that is not actually on the AA cross-section line.

Also in the semiconductor device 1a according to the variation 1, the first lead 21 extends from under (the −Z side of) the first electrode 11 along the first surface S1 in the +X direction beyond the edge E3, which is a part of the periphery of the first surface S1 located in the +X direction. Moreover, the first lead 21 also extends from under the first electrode 11 along the first surface S1 in the −X direction beyond the edge E1, which is a part of the periphery of the first surface S1 located in the −X direction.

The second lead 22 also extends from under the second electrode 12 along the first surface S1 beyond the edge E3, which is a part of the periphery of the first surface S1 located in the +X direction, and beyond the edge E1, which is a part of the periphery of the first surface S1 located in the −X direction. Furthermore, the second lead 22 extends beyond the edge E4, which is a part of the periphery of the first surface S1 located in the +Y direction.

Also in the semiconductor device 1a according to the variation 1, one edge E1 out of the edges E1 to E4 constituting the periphery of the first surface S1 of the semiconductor element 10 faces neither the first lead 21 nor the second lead 22.

Also in the semiconductor device 1a according to the variation 1, portions of the first lead 21 that face edges E3 and E1 of the periphery of the first surface S1 of the semiconductor element 10 are provided with grooves G1a and G1b, respectively.

In addition, portions of the second lead 22 that face edges E3, E2, and E1 of the periphery of the first surface S1 of the semiconductor element 10 are provided with a groove G2a that is continuously formed.

This configuration also results in an improvement in the insulation properties between the periphery (edges E1 to E4) of the first surface S1 of the semiconductor element 10 and the first lead 21 as well as the second lead 22.

(Semiconductor Device of Variation 2)

A semiconductor device 1b according to a variation 2 will be described with reference to FIG. 4. Note that a most part of a configuration of the semiconductor device 1b according to the variation 2 is common to the above-described semiconductor device 1 according to the first embodiment. Thus, differences between them will be mainly described below, and common components are denoted by the same reference symbols and will not be described as appropriate.

Figure 4:
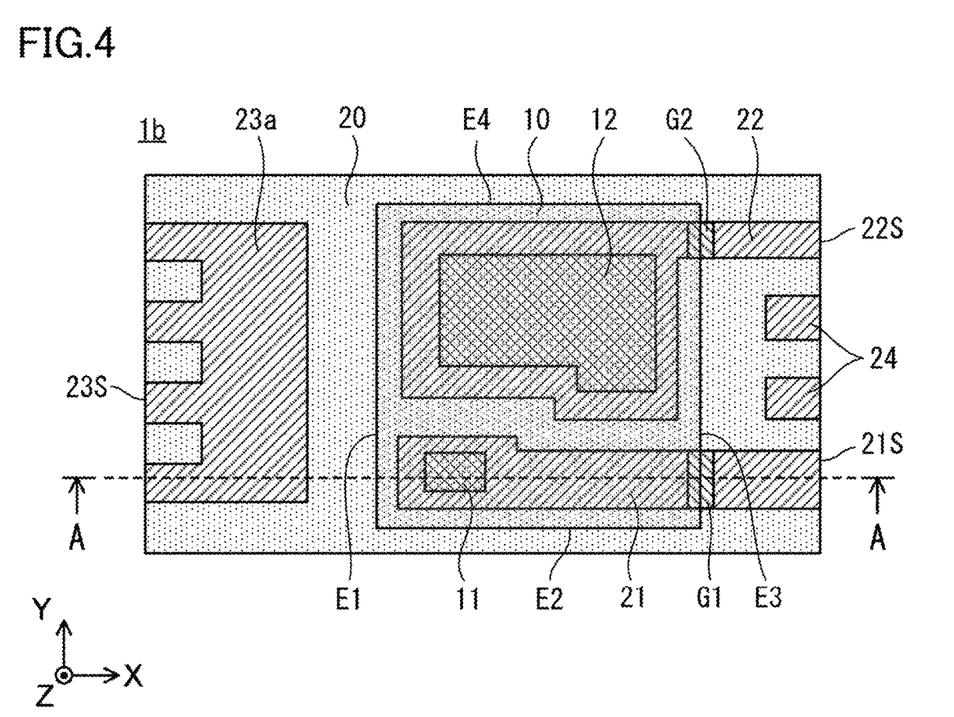
FIG. 4 is a view illustrating a schematic configuration of a semiconductor device according to a variation 2.

FIG. 4 is a view illustrating a top-view state of the semiconductor device 1b according to the variation 2, which corresponds to FIG. 1A illustrating the semiconductor device 1 according to the first embodiment. An XZ cross-sectional view of the semiconductor device 1b along an AA cross-section line in FIG. 4 is the same as the XZ cross-sectional view of the semiconductor device 1 according to the first embodiment in FIG. 1B, and thus is not illustrated.

In the semiconductor device 1b according to the variation 2, the width of the second lead 22 in the Y direction is narrower at portions near and beyond the edge E3 in the +X direction (the edge E3 is a part of the periphery of the first surface S1 located in the +X direction) than the width at a portion of the second lead 22 located in the −X direction from the edge E3. Thus, the groove G2 at a portion of the second lead 22 that faces the edge E3 of the periphery of the first surface S1 of the semiconductor element 10 is also shorter in the Y direction accordingly than the groove G2 of the above-described semiconductor device 1 according to the first embodiment.

This configuration also results in an improvement in the insulation properties between the periphery (edges E1 to E4) of the first surface S1 of the semiconductor element 10 and the first lead 21 as well as the second lead 22.

Note that the semiconductor device 1b includes dummy leads 24 between the first lead 21 and the second lead 22 at an end on the +X side. The dummy leads 24 are not electrically connected to any of the first lead 21, the second lead 22, the third lead 23, and the semiconductor element 10. The dummy leads 24 are provided for preventing cutting force from concentrating on the first lead 21 and the second lead 22 when semiconductor devices 1b are manufactured, more particularly, a plurality of semiconductor devices 1b formed side by side on a substrate are cut out from one another.

The various embodiments have been described above, but the present invention is not limited to the details thereof. The embodiments may be utilized individually or in combination thereof. Another mode conceivable within the technical idea of the present invention also falls within the scope of the present invention.

The present application claims the benefit of priority from Japanese Patent Application No. 2020-082299 (filed on May 8, 2020), the content of which is incorporated herein by reference.

The invention claimed is:

1. A semiconductor device comprising:
a semiconductor element having a first electrode and a second electrode on a first surface facing in a first direction, and a third electrode on a second surface facing in an opposite direction to the first direction, wherein continuity between the second electrode and the third electrode is controlled by a voltage applied to the first electrode;
a conductive first lead that is electrically connected to the first electrode via a first conductive bonding material and extends beyond a periphery of the first surface while keeping a certain gap from the first surface;

a conductive second lead that is electrically connected to the second electrode via a second conductive bonding material and extends beyond the periphery of the first surface while keeping a certain gap from the first surface; and a conductive third lead that is electrically connected to the third electrode and extends along the second surface beyond a periphery of the second surface, wherein the third lead bends outside the periphery toward the first direction;

wherein the periphery of the first surface of the semiconductor element has edges, at least one of which faces neither the first lead nor the second lead, portions of the first lead and the second lead that face the periphery of the first surface of the semiconductor element are provided with respective grooves, the first electrode is formed inside the periphery of the first surface, a periphery of the first lead, and the groove of the first lead, and the second electrode is formed inside the periphery of the second surface, a periphery of the second lead, and the groove of the second lead.

2. The semiconductor device according to claim 1, wherein
a direction in which the third lead extends with respect to the third electrode is opposite to a direction in which the first lead extends with respect to the first electrode or to a direction in which the second lead extends with respect to the second electrode.

3. The semiconductor device according to claim 1, wherein
an edge of the periphery of the first surface of the semiconductor element across which the third lead extends faces neither the first lead nor the second lead.

4. The semiconductor device according to claim 1, further comprising
an electrically-insulating sealing portion that seals at least parts of the semiconductor element, the first lead, the second lead, and the third lead.

5. The semiconductor device according to claim 4, wherein
the first lead and the second lead have respective bottom surfaces on an opposite side to a side facing the first surface of the semiconductor element, the bottom surfaces being on a same plane as a bottom surface of the sealing portion.

6. The semiconductor device according to claim 4, wherein
the first lead, the second lead, and the third lead have respective bottom surfaces facing in the first direction, and respective side surfaces facing in a direction perpendicular to the first direction on a far side from the semiconductor element, the bottom surfaces and the side surfaces being exposed from the sealing portion.

7. The semiconductor device according to claim 1, wherein
the first lead and the second lead have no bent portions bending toward the first direction.

8. The semiconductor device according to claim 1, wherein
the grooves have a depth of 30% or more and 70% or less of a thickness of the first lead and the second lead.

9. The semiconductor device according to claim 1, wherein
the first surface has a shape of rectangle.

10. The semiconductor device according to claim 1, wherein
the first conductive bonding material is a bump having a height of 0.02 to 0.10 mm.

* * * * *